United States Patent
Hubbard et al.

(10) Patent No.: US 11,175,685 B2
(45) Date of Patent: Nov. 16, 2021

(54) AUTOMATIC INPUT/OUTPUT VOLTAGE CONTROL

(71) Applicant: TEXAS INSTRUMENTS INCORPORATED, Dallas, TX (US)

(72) Inventors: Richard Edwin Hubbard, Allen, TX (US); Richard Sterling Broughton, Dallas, TX (US); Vijayalakshmi Devarajan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/914,938

(22) Filed: Jun. 29, 2020

(65) Prior Publication Data

US 2020/0326738 A1   Oct. 15, 2020

Related U.S. Application Data

(63) Continuation of application No. 16/235,631, filed on Dec. 28, 2018, now Pat. No. 10,732,654.

(60) Provisional application No. 62/672,210, filed on May 16, 2018.

(51) Int. Cl.
| | |
|---|---|
| G05F 1/46 | (2006.01) |
| H03K 17/00 | (2006.01) |
| H03K 5/24 | (2006.01) |
| H03K 3/3565 | (2006.01) |

(52) U.S. Cl.
CPC .......... *G05F 1/465* (2013.01); *H03K 3/3565* (2013.01); *H03K 5/24* (2013.01); *H03K 17/005* (2013.01)

(58) Field of Classification Search
CPC ........ G05F 1/465; H03K 17/005; H03K 5/24; H03K 3/3565
See application file for complete search history.

(56) References Cited

U.S. PATENT DOCUMENTS

| | | | |
|---|---|---|---|
| 6,639,426 B2 * | 10/2003 | Haycock | H04L 1/243 326/16 |
| 7,323,906 B2 * | 1/2008 | Seo | G01R 31/31715 326/16 |
| 2014/0035549 A1 | 2/2014 | Hafizi et al. | |

* cited by examiner

*Primary Examiner* — Daniel D Chang
(74) *Attorney, Agent, or Firm* — John R. Pessetto; Charles A. Brill; Frank D. Cimino

(57) ABSTRACT

An integrated circuit includes an input terminal, an input buffer circuit, an interface voltage control circuit, an output voltage selection circuit, an output driver circuit, and an output terminal. The input buffer circuit is coupled to the input terminal. The interface voltage control circuit is coupled to the input terminal. The output voltage selection circuit is coupled to the interface voltage control circuit. The output driver circuit is coupled to the output voltage selection circuit. The output terminal is coupled to the output driver circuit.

5 Claims, 3 Drawing Sheets

AUTOMATIC INPUT/OUTPUT VOLTAGE CONTROL

CROSS-REFERENCE TO RELATED APPLICATIONS

This continuation application claims priority to U.S. patent application Ser. No. 16/235,631, filed Dec. 28, 2018, which claims priority to and the benefit of U.S. Provisional Patent Application No. 62/672,210, filed May 16, 2018, both of which are hereby incorporated herein by reference in their entirety.

BACKGROUND

Electronic systems often include circuits that are powered by different power supply voltages, or that require different signal levels to activate circuit components. Such systems include circuitry to translate signals between different voltage levels. For example, some such systems include level shifting circuits (level shifters) are used to translate signals from one voltage level to another. A level shifter may be used to translate a signal from a lower voltage to a higher voltage, or to translate a signal from a higher voltage to a lower voltage.

SUMMARY

In one example, a system includes a first integrated circuit, a pull-up resistor, and a second integrated circuit. The first integrated circuit includes an open drain output terminal and an input terminal. The pull-up resistor is coupled to the open drain output terminal. The second integrated circuit includes an input terminal, an interface voltage control circuit, an output voltage selection circuit, an output driver circuit, and an output terminal. The input terminal of the second integrated circuit is coupled to the open drain output terminal of the first integrated circuit. The interface voltage control circuit is coupled to the input terminal of the second integrated circuit. The output voltage selection circuit is coupled to the interface voltage control circuit. The output driver circuit is coupled to the output voltage selection circuit. The output terminal of the second integrated circuit is coupled to the output driver circuit and to the input terminal of the first integrated circuit.

In another example, an integrated circuit includes an input terminal, an input buffer circuit, an interface voltage control circuit, an output voltage selection circuit, an output driver circuit, and an output terminal. The input buffer circuit is coupled to the input terminal. The interface voltage control circuit is coupled to the input terminal. The output voltage selection circuit is coupled to the interface voltage control circuit. The output driver circuit is coupled to the output voltage selection circuit. The output terminal is coupled to the output driver circuit.

In a further example, an integrated circuit includes an input terminal, an input buffer circuit, an interface voltage control circuit, an output terminal, an output driver circuit, and an output voltage selection circuit. The input terminal is configured to receive an input signal. The input buffer circuit is coupled to the input terminal, and is configured to drive the input signal to an internal circuit. The interface voltage control circuit is coupled to the input terminal, and is configured to identify a power supply voltage corresponding to a voltage provided at the input terminal. The output terminal is configured to provide an output signal. The output driver circuit is coupled to the output terminal, and is configured to drive the output signal to the output terminal. The output voltage selection circuit is coupled to the interface voltage control circuit and the output driver circuit, and is configured to provide the power supply voltage identified by the interface voltage control circuit to the output driver circuit.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Level shifter circuits are frequently used to interface integrated circuits (or electronic devices generally) that have different input/output voltages. However, adding level shifter circuits to a system increases system cost and circuit area. In another option, an integrated circuit includes a dedicated input/output power supply terminal for receiving a voltage used to power output circuitry in accordance with the input voltage requirements of different integrated circuit. Adding dedicated power terminals to an integrated circuit increase the cost of the packaged integrated circuit.

The integrated circuits disclosed herein include circuitry that identifies the input/output voltage of a connected device and, based on the identified input/output voltage, selects a suitable output voltage to apply in the output driver circuits of the integrated circuit. The integrated circuits of the present disclosure do not include dedicated input/output voltage pins, and can interface with devices with various input/output voltage requirements without level shifter circuits. Thus, implementations of the integrated circuits described herein reduce overall system size and cost and/or packaged integrated circuit cost relative to other multi-voltage interface solutions.

Figure 1:
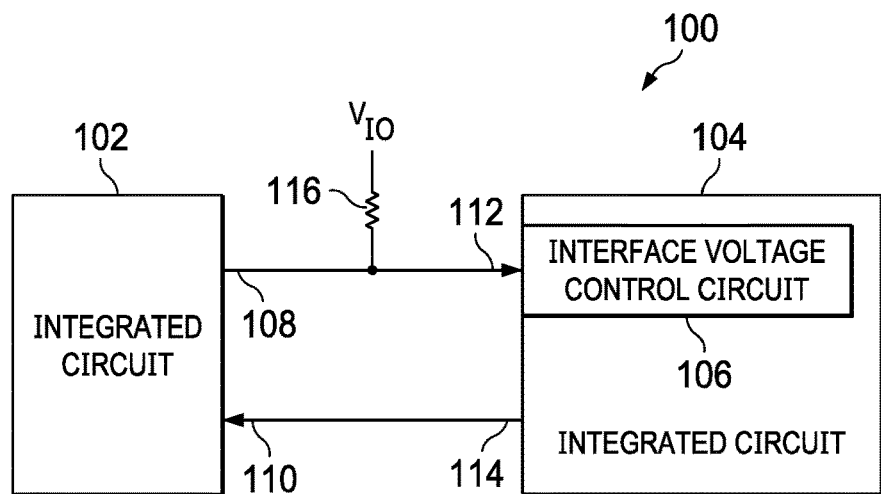
FIG. 1 shows a block diagram for an example system that includes interface voltage control in accordance with the present disclosure.

FIG. 1 shows a block diagram for an example system 100 that includes interface voltage control in accordance with the present disclosure. The system 100 includes an integrated circuit 102 and an integrated circuit 104. The integrated circuit 102 includes an open drain output terminal 108 and an input terminal 110. The integrated circuit 104 includes an input terminal 112 and an output terminal 114. The open drain output terminal 108 of the integrated circuit 102 is coupled to the input terminal 112 of the integrated circuit 104 to allow the integrated circuit 104 to receive, via the input terminal 112, an input signal generated by the integrated circuit 102. The output terminal 114 of the integrated circuit 104 is coupled to the input terminal 110 of the integrated circuit 102, and provides an output signal to the integrated circuit 102. A pull-up resistor 116 is coupled to the open drain output terminal 108 of the integrated circuit 102 and to the input terminal 112 of the integrated circuit 104. The pull-up resistor 116 pulls the input terminal 112 of the integrated circuit 104 up to an input/output voltage of the integrated circuit 102 when the open-drain output of the integrated circuit 102 is inactive.

The integrated circuit 104 includes interface voltage control circuit 106 coupled to the input terminal 112. The interface voltage control circuit 106 identifies the voltage at the input terminal 112 (i.e., the voltage to which the input terminal 112 is pulled up by the pull-up resistor 116), and sets output circuitry of the integrated circuit 104 to drive the output terminal 114 with a voltage corresponding to the voltage identified at the input terminal 112. Thus, the integrated circuit 104 automatically identifies the input/output voltage of the integrated circuit 102 and provides a corresponding input/output voltage on signals generated by the integrated circuit 104 for communication with the integrated circuit 102. No level shifter circuits are interposed between the integrated circuit 102 and the integrated circuit 104, and the integrated circuit 104 needs no dedicated I/O voltage pins.

Figure 2:
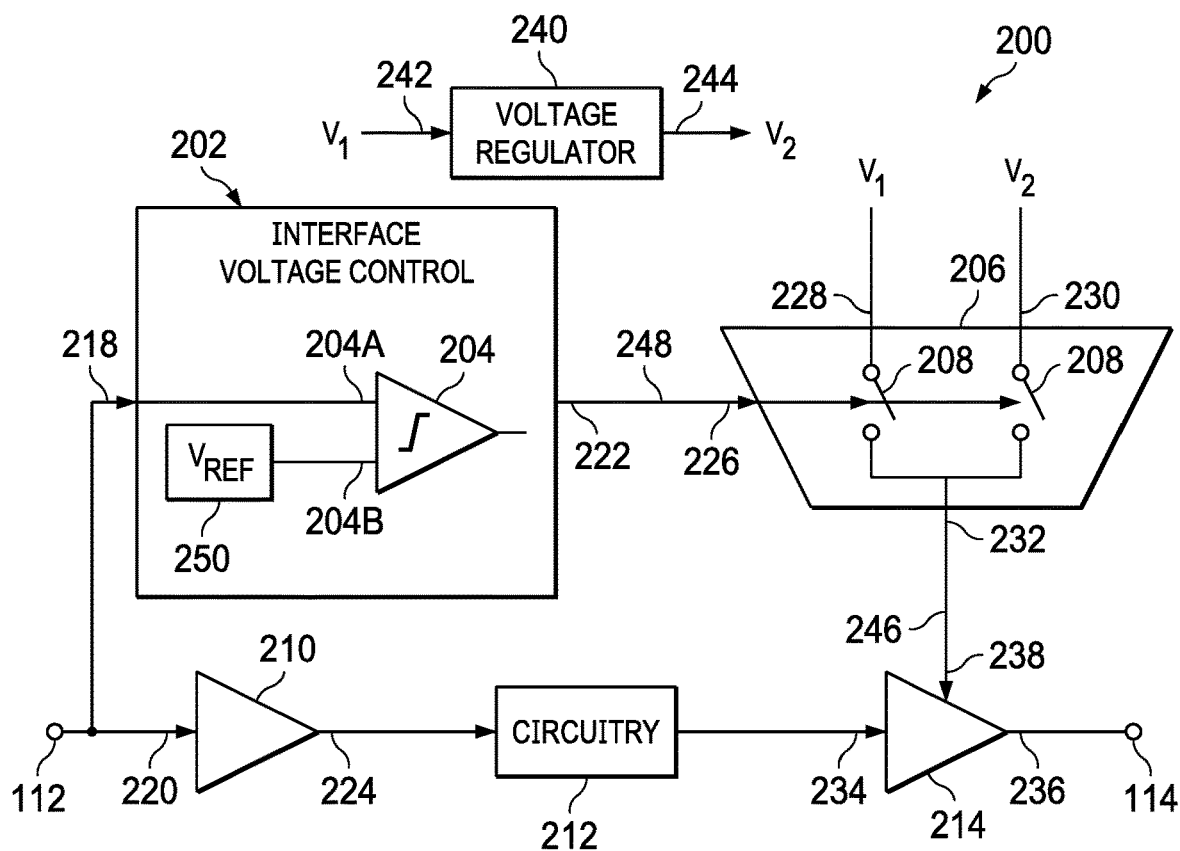
FIG. 2 shows a block diagram for an example integrated circuit that includes interface voltage control in accordance with the present disclosure.

FIG. 2 shows a block diagram for an example integrated circuit 200 that includes interface voltage control in accordance with the present disclosure. The integrated circuit 200 is an implementation of the integrated circuit 104. The integrated circuit 200 includes the input terminal 112, an input buffer circuit 210, an interface voltage control circuit 202, an output voltage selection circuit 206, an output driver circuit 214, and internal circuitry 212. The input terminal 112 is coupled to an input terminal 220 of the input buffer circuit 210 and an input terminal 218 of the interface voltage control circuit 202. An output terminal 224 of the input buffer circuit 210 is coupled to the internal circuitry 212. The input buffer circuit 210 buffers an input signal received via the input terminal 112 (e.g., input signal received from the integrated circuit 102) and provides the buffered input signal to the internal circuitry 212. The internal circuitry 212 includes logic circuitry that receives and processes the buffered input signal. For example, the integrated circuit 200 is a digital communication device in one implementation, and the internal circuitry 212 includes logic circuits to format the buffered input signal for communication via a predetermined communication protocol (e.g., controller area network protocol). The internal circuitry 212 provides different functionality in other implementations of the integrated circuit 200.

The internal circuitry 212 is coupled to an input terminal 234 of the output driver circuit 214. An output terminal 236 of the output driver circuit 214 is coupled to the output terminal 114. The output driver circuit 214 drives signal received from the internal circuitry 212 to the output terminal 114 (e.g., for transmission to the integrated circuit 102). The output driver circuit 214 includes an input terminal 238 that is coupled to an output terminal 232 of the output voltage selection circuit 206. The output voltage selection circuit 206 provides, to the output driver circuit 214, an output voltage 246 that the output driver circuit 214 applies to generate signals driven to the output terminal 114. The output voltage selection circuit 206 selects the output voltage 246 from a plurality of power supply voltages (V1, V2, etc.). The output voltage selection circuit 206 includes power supply input terminal 228 and power supply input terminal 230, each of which is coupled to a switch 208, and to a power supply voltage source such as a power supply rail. The switch 208 corresponds to a selected output voltage and is closed to provide the selected power supply voltage to the output driver circuit 214. Implementations of the output voltage selection circuit 206 include any number of power supply terminals and switches as needed to support a number of different output voltages.

The output voltage selection circuit 206 includes an input terminal 226 that is coupled to an output terminal 222 of the interface voltage control circuit 202. The interface voltage control circuit 202 is an implementation of the interface voltage control circuit 106. The interface voltage control circuit 202 provides (via the output terminal 222) one or more control signals 248 to the output voltage selection circuit 206 for controlling the switches 208 and selecting the output voltage 246 provided to the output driver circuit 214. The interface voltage control circuit 202 identifies the voltage at the input terminal 112, and generates the control signals 248 to select an output voltage 246 corresponding the voltage identified at the input terminal 112. The interface voltage control circuit 202 includes a comparator circuit 204 that compares the voltage at the input terminal 112 to a reference voltage to identify the voltage at the input terminal 112. The comparator circuit 204 includes an input terminal 204A coupled to the input terminal 112, and an input terminal 204B coupled to a reference voltage source 250. The reference voltage source 250 may be a power supply rail, resistive voltage divider, a semiconductor voltage reference device, etc.

The output of the comparator circuit 204 determines the state of the control signals 248. For example, if the integrated circuit 200 is configured to determine whether the voltage at the input terminal 112 is 5 volts or 3.3V, then during power up initialization the comparator circuit 204 compares the voltage at the input terminal 112 to a reference voltage (e.g., 4 volts) if the voltage at the input terminal 112 is less than the reference voltage, then control signals 248 are set to cause the output voltage selection circuit 206 to switch 3.3 volts to the output driver circuit 214. If the voltage at the input terminal 112 is greater than the reference voltage, then the control signals 248 are set to cause the output voltage selection circuit 206 to switch 5 volts to the output driver circuit 214. Thus, the output of the comparator 214 is coupled to the output voltage selection circuit 206 in some implementations of the 200.

Some implementations of the integrated circuit 200 also include one or more voltage regulator circuits 240 that generate the power supply voltage(s) provided to the output voltage selection circuit 206. For example, in FIG. 2, the voltage regulation circuit 240 includes an input 242 that is coupled to the input 228 of the output voltage selection circuit 206 (coupled to a first power supply voltage source) and an output 244 that is coupled to the input 230 of the output voltage selection circuit 206. The voltage regulator circuit 240 generates the voltage provided at the input 230 of the output voltage selection circuit 206 based on the voltage provided at the input 228 of the output voltage selection circuit 206. For example, the voltage regulation circuit generates 3.3 volts based on 5 volts.

Figure 3:
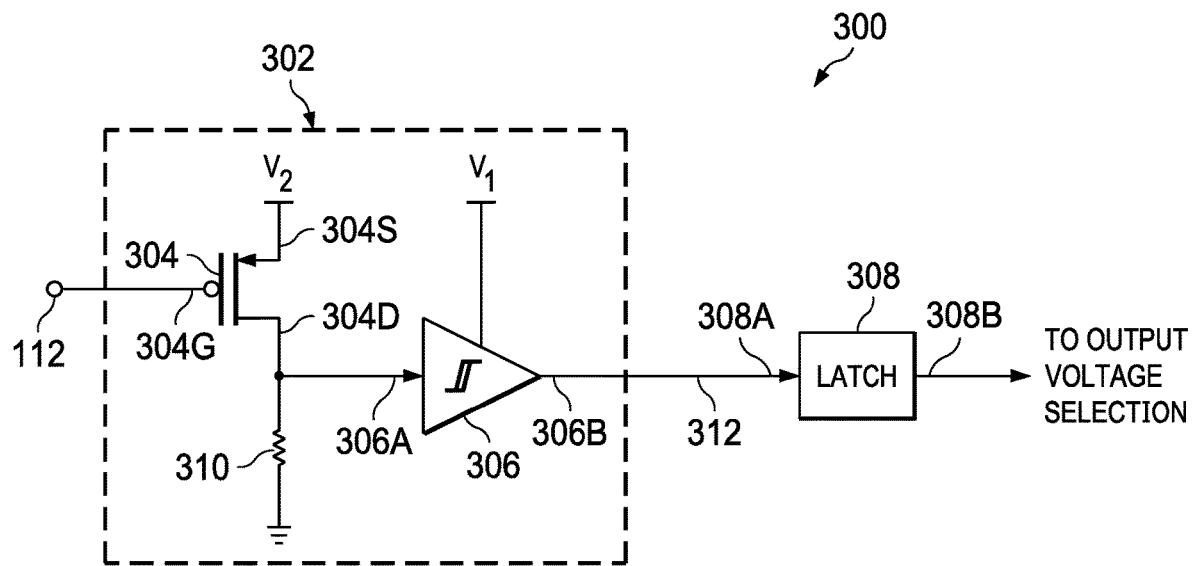
FIG. 3 shows a schematic diagram for an example output voltage selection circuit suitable for use in interface voltage control in accordance with the present disclosure.

The interface voltage control circuit 202 is subject to a variety of implementations. FIG. 3 shows a schematic diagram for an example interface voltage control circuit 300 suitable for use in interface voltage control in accordance with the present disclosure. The interface voltage control circuit 300 is an implementation of the interface voltage control circuit 202. The interface voltage control circuit 300 includes a comparator 302 and a latch 308. The comparator 302 includes a transistor 304 and a Schmitt trigger circuit 306. A gate terminal 304G of the transistor 304 is coupled to the input terminal 112, a source terminal 304S of the transistor 304 is coupled to a reference voltage source, and a drain terminal 304D of the transistor 304 is coupled to ground via a resistor 310. An input terminal 306A of the Schmitt trigger circuit 306 is coupled to the drain terminal 304D of the transistor 304. If the voltage at the input terminal 112 is lower than the reference voltage such that the gate-source voltage of the transistor 304 exceeds the gate-source threshold voltage of the transistor 304, then the transistor 304 turns on, and the voltage at the input terminal 306A rises to about the reference voltage, causing the voltage at the output terminal 306B of the Schmitt trigger circuit 306 to go to ground. Thus, in this example, if the interface voltage control circuit 300 is to identify 5 volts or 3.3 volts at the input terminal 112 and the reference voltage ($V_2$) is 5 volts, then if the output terminal 306B is at ground, the voltage at the input terminal 112 is deemed to be 5 volts, and if the output terminal 306B is not at ground (e.g., is at $V_1$ (3.3 volts)), then the voltage at the input terminal 112 is deemed to be 3.3 volts.

The output terminal 306B of the Schmitt trigger circuit 306 is coupled to an input terminal 308A of the latch 308. The latch 308 latches the state of the output signal 312 generated by the comparator 302. For example, the latch 308 may latch the signal 312 at the end of power up initialization. An output terminal 308B of the latch 308 is coupled to the input terminal 226 of the output voltage selection circuit 206 to provide the latched control signals 248 to the switches 208.

Figure 4:
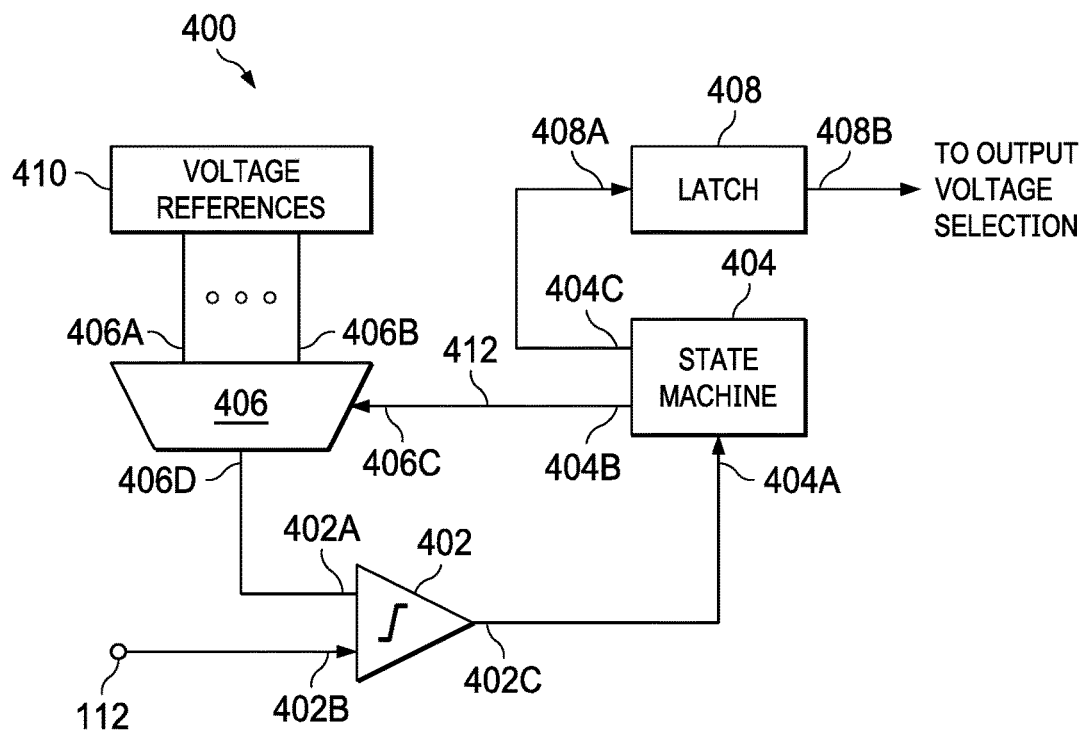
FIG. 4 shows a schematic diagram for another example output voltage selection circuit suitable for use in interface voltage control in accordance with the present disclosure.

FIG. 4 shows a schematic diagram for another example interface voltage control circuit 400 suitable for use in interface voltage control in accordance with the present disclosure. The interface voltage control circuit 400 is an implementation of the interface voltage control circuit 202. The interface voltage control circuit 400 allows for identification of more than two different voltages at the input terminal 112 and selection of more than two output voltages in the output voltage selection circuit 206. The interface voltage control circuit 400 includes a comparator 402, a state machine 404, a voltage multiplexer circuit 406, a latch 408, voltage references 410. The voltage references 410 include circuitry, such as resistor dividers to generate a plurality of reference voltages for comparison to the voltage at the input terminal 112 by the comparator 402.

The state machine 404 controls the selection of reference voltages by the voltage multiplexer circuit 406 based on the output of the comparator 402. The state machine 404 includes an input 404A coupled to an output 402C of the comparator 402, and an output 404B coupled to a control input 406C of the voltage multiplexer circuit 406. The voltage multiplexer circuit 406 routes a reference voltage to the comparator 402 based on the control signal(s) 412 provided by the state machine 404. The voltage multiplexer circuit 406 includes an input 406A coupled to the voltage references 410 and an input 406B coupled to the voltage references 410. The reference voltage provided by the voltage references 410 at the input 406A is different from the reference voltage provided by the voltage references 410 at the input 406B.

The output 406D of the voltage multiplexer circuit 406 is coupled to an input 402A of the comparator 402. An input 402B of the comparator 402 is coupled to the input terminal 112. The voltage multiplexer circuit 406 routes a reference voltage selected by the control signal(s) 412 to the comparator 402, and the comparator 402 compares the reference voltage to the voltage at the input terminal 112. The results of the comparison are provided to the state machine 404 for determination of whether the voltage at the input terminal 112 has been identified. When the voltage at the input terminal 112 has been identified, then operation of the state machine 404 is complete, and signals identifying the voltage at the input terminal 112 (provided at output 404C of the state machine 404) are latched in the latch 408. The latch 408 includes an input 408A that is coupled to the output 404C of the state machine 404, and an output 408B that is coupled to the input terminal 226 of the output voltage selection circuit 206.

In an example of operation of the interface voltage control circuit 400, the interface voltage control circuit 400 is configured to identify 5 volts, 3.3 volts, and 2.5 volts at the input terminal 112. Initially, the state machine 404 generates control signal(s) 412 causing the voltage multiplexer circuit 406 to route the reference voltage (e.g., 4 volts) at the input 406A to the 406D. If the output of the comparator 402 indicates that the voltage at the input terminal 112 is greater than reference voltage, then the voltage at the input terminal 112 is deemed to be 5 volts, and operation of the state machine 404 is complete. On the other hand, if the output of the comparator 402 indicates that the voltage at the input terminal 112 is less than reference voltage, then the state machine 404 generates control signal(s) 412 causing the voltage multiplexer circuit 406 to route the reference voltage (e.g., 2.9 volts) at the input 406B to the 406D. If the output of the comparator 402 indicates that the voltage at the input terminal 112 is greater than reference voltage, then the voltage at the input terminal 112 is deemed to be 3.3 volts. Otherwise, the voltage at the input terminal 112 is deemed to be 2.5 volts. The state machine 404 sets output 404C to indicate the voltage identified at the input terminal 112, and the latch 408 latches the signals at the output 404C for provision to the output voltage selection circuit 206.

Figure 5:
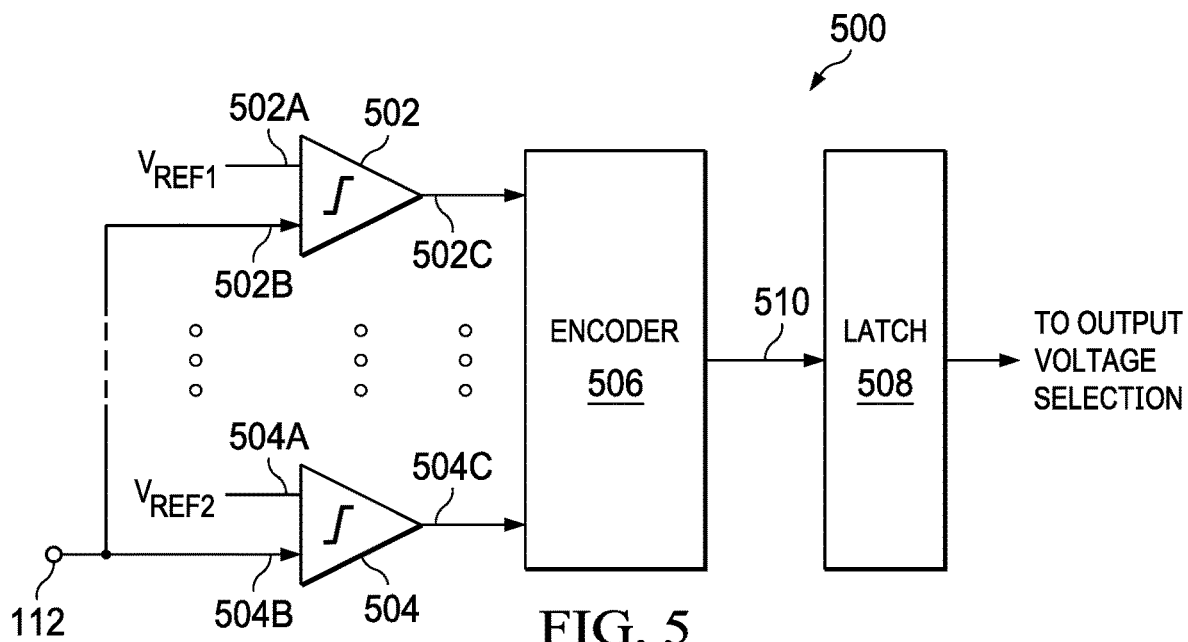
FIG. 5 shows a schematic diagram for a further example output voltage selection circuit suitable for use in interface voltage control in accordance with the present disclosure.

FIG. 5 shows a schematic diagram for a further example interface voltage control circuit 500 suitable for use in interface voltage control in accordance with the present disclosure. The interface voltage control circuit 500 includes a plurality of comparators, an encoder circuit 506, and a latch 508. While FIG. 5 shows a comparator 502, and a comparator 504, implementations of the interface voltage control circuit 500 include any number of comparators. Each of the comparators is coupled to the input terminal 112 and to a reference voltage source, so that each comparator compares the voltage at the input terminal 112 to a different reference voltage. The outputs of the comparators are coupled to the encoder circuit 506. The encoder circuit 506 generates a code 510 identifying the voltage at the input terminal 112. The encoder circuit 506 is coupled to the latch 508. The latch 508 latches the code 510 for use in controlling the output voltage selection circuit 206.

Table 1 below shows an example of output of the comparators 502 and 504, and corresponding code 510 generated by the encoder circuit 506. The encoder circuit 506 may provide different values of the code 510 in some implementations of the interface voltage control circuit 500.

TABLE 1

| Comparator 502 | Comparator 504 | Code 510 |
|---|---|---|
| 1 | 1 | 100 (5 volts) |
| 0 | 1 | 010 (3.3 volts) |
| 0 | 0 | 001 (2.5 volts) |

Figure 6:
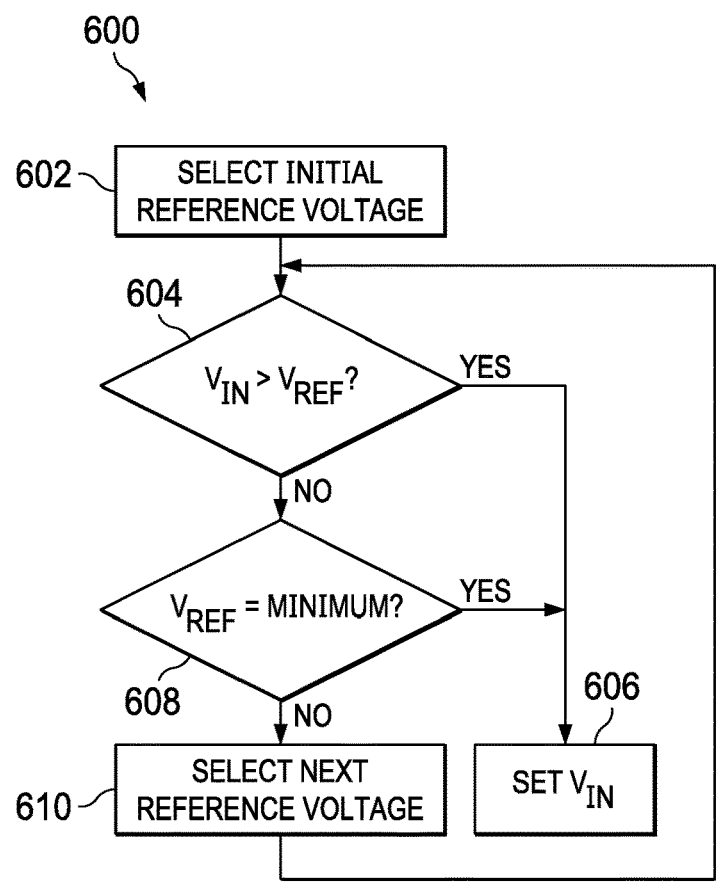
FIG. 6 shows a flow diagram for an example method for identifying and input voltage and selecting an output voltage in accordance with the present disclosure.

FIG. 6 shows a flow diagram for an example method 600 for selecting an output voltage in accordance with the present disclosure. Though depicted sequentially as a matter of convenience, at least some of the actions shown can be performed in a different order and/or performed in parallel. Additionally, some implementations may perform only some of the actions shown. Operations of the method 600 may be performed by an implementation of the interface voltage control circuit 400. The method 600 is explained with reference to an implementation of the interface voltage control circuit 400 configured to identify whether the voltage at the input terminal 112 is 5 volts, 3.3 volts, 2.5 volts, or 1.8 volts. Some implementations are configured to identify different voltages and/or a different number of voltages at the input terminal 112.

In block 606, the interface voltage control circuit 400 selects an initial reference voltage to be compared to the voltage at the input terminal 112. In the present example, the interface voltage control circuit 400 selects 4 volts (or other suitable voltage) for comparison to the voltage at the input terminal 112, and causes the voltage multiplexer circuit 406 to route the selected reference voltage to the comparator 402.

In block 604, the comparator 402 compares the reference voltage (4V) to the voltage at the input terminal 112. If the voltage at the input terminal 112 is greater than the reference voltage, then the voltage at the input terminal 112 has been identified (5V), and signals identifying the voltage at the input terminal 112 and that control the output voltage 246 are latched in block 606.

If the voltage at the input terminal 112 is less than the reference voltage, then in block 608, the interface voltage control circuit 400 determines whether the reference voltage currently being compared to the voltage at the input terminal 112 is the minimum reference voltage provided in the interface voltage control circuit 400. If the reference voltage currently being compared to the voltage at the input terminal 112 is not the minimum reference voltage provided in the interface voltage control circuit 400, then, in block 610, the interface voltage control circuit 400 selects the next lower reference voltage (3 volts or other suitable voltage) for comparison to the voltage at the input terminal 112, and causes the voltage multiplexer circuit 406 to route the selected reference voltage to the comparator 402.

In block 604, the comparator 402 compares the reference voltage (3V) to the voltage at the input terminal 112. If the voltage at the input terminal 112 is greater than the reference voltage, then the voltage at the input terminal 112 has been identified (3.3V), and signals identifying the voltage at the input terminal 112 and that control the output voltage 246 are latched in block 606.

If the voltage at the input terminal 112 is less than the reference voltage, then in block 608, the interface voltage control circuit 400 determines whether the reference voltage currently being compared to the voltage at the input terminal 112 is the minimum reference voltage provided in the interface voltage control circuit 400. If the reference voltage currently being compared to the voltage at the input terminal 112 is not the minimum reference voltage provided in the interface voltage control circuit 400, then, in block 610, the interface voltage control circuit 400 selects the next lowest reference voltage (2 volts or other suitable voltage) for comparison to the voltage at the input terminal 112, and causes the voltage multiplexer circuit 406 to route the selected reference voltage to the comparator 402.

In block 604, the comparator 402 compares the reference voltage (2V) to the voltage at the input terminal 112. If the voltage at the input terminal 112 is greater than the reference voltage, then the voltage at the input terminal 112 has been identified (2.5V), and signals identifying the voltage at the input terminal 112 and that control the output voltage 246 are latched in block 606.

If the voltage at the input terminal 112 is less than the reference voltage, then in block 608, the interface voltage control circuit 400 determines whether the reference voltage currently being compared to the voltage at the input terminal 112 is the minimum reference voltage provided in the interface voltage control circuit 400. If the reference voltage currently being compared to the voltage at the input terminal 112 is the minimum reference voltage provided in the interface voltage control circuit 400, then the voltage at the input terminal 112 has been identified (1.8V), and signals identifying the voltage at the input terminal 112 and that control the output voltage 246 are latched in block 606.

Some implementations of the method 600 apply different operations to identify the voltage at the input terminal 112. For example, an implementation of the method 600 applies the reference voltage starting with the lowest reference voltage and successively applying increasing reference voltages to identify the voltage at the input terminal 112. Another implementation of the 112 applies a binary search to identify the voltage at the input terminal 112.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
   an input terminal;
   an input buffer circuit coupled to the input terminal;
   a comparator circuit coupled to the input terminal;
   an output voltage selection circuit coupled to the comparator circuit;
   an output driver circuit coupled to the output voltage selection circuit; and
   an output terminal coupled to the output driver circuit.

2. The integrated circuit of claim 1, wherein the output voltage selection circuit comprises:
   a first input coupled to a first power supply voltage source;
   a second input coupled to a second power supply voltage source;
   a third input coupled to an output of the comparator circuit; and
   an output coupled to the output driver circuit.

3. The integrated circuit of claim 2, further comprising a voltage regulator circuit comprising:
 an input coupled to the first power supply voltage source; and
 an output that is the second power supply voltage source.

4. An integrated circuit, comprising:
 an input terminal configured to receive an input signal;
 an input buffer circuit coupled to the input terminal, and configured to drive the input signal to an internal circuit;
 a comparator circuit coupled to the input terminal, and configured to identify a power supply voltage corresponding to a voltage provided at the input terminal;
 an output terminal configured to provide an output signal;
 an output driver circuit coupled to the output terminal, and configured to drive the output signal to the output terminal;
 an output voltage selection circuit coupled to the comparator circuit and the output driver circuit, and configured to provide the power supply voltage identified by the comparator circuit to the output driver circuit.

5. The integrated circuit of claim 4, further comprising a voltage regulator circuit configured to generate the power supply voltage identified by the comparator circuit.

\* \* \* \* \*